(12) United States Patent
Messinger

(10) Patent No.: US 10,593,537 B1
(45) Date of Patent: Mar. 17, 2020

(54) LONGITUDINAL SILICON INGOT SLICING MACHINE AND JIG FIXTURE

(71) Applicant: Samuel Messinger, Ramot Bet Shemish (IL)

(72) Inventor: Samuel Messinger, Ramot Bet Shemish (IL)

( * ) Notice: Subject to any disclaimer, the term of this patent is extended or adjusted under 35 U.S.C. 154(b) by 0 days.

(21) Appl. No.: 16/360,020

(22) Filed: Mar. 21, 2019

(51) Int. Cl.
    *B28D 5/00* (2006.01)
    *H01L 21/02* (2006.01)
    *C30B 29/06* (2006.01)
    *B28D 5/04* (2006.01)
    *H01L 21/304* (2006.01)

(52) U.S. Cl.
    CPC ........ *H01L 21/02008* (2013.01); *B28D 5/045* (2013.01); *C30B 29/06* (2013.01); *H01L 21/304* (2013.01)

(58) Field of Classification Search
    CPC .......... B28D 5/04; B28D 5/0088; B28D 5/00; B23D 57/00
    USPC ....... 125/16.02, 16.01, 21, 35; 451/168, 296
    See application file for complete search history.

(56) References Cited

U.S. PATENT DOCUMENTS

| | | | |
|---|---|---|---|
| 3,478,732 A * | 11/1969 | Clark | B23D 57/0053 125/12 |
| 5,628,301 A | 5/1997 | Katamachi | |
| 5,829,424 A | 11/1998 | Hauser | |
| 6,107,163 A * | 8/2000 | Kojima | B23D 57/0023 257/E21.238 |

* cited by examiner

*Primary Examiner* — Robert A Rose

(57) ABSTRACT

The present subject matter discloses a method of lateral slicing of cylindrical silicon ingot to maximize resulting chips yield as compared to the conventional transverse slicing of ingot. The resulting rectangular wafers made from lateral slicing of ingot maximizes yield as by the lateral slicing of ingot, overall chips per wafer ratio gets increased as compared to transversal cutting while the said method decreases waste due to conflict between chip and wafer geometry. The novel apparatus or system of present method includes JIG having plurality of parallel bars. The JIG is provided to covers and holds the ingot during slicing while the parallel bars of JIG between which diamond dust embedded wires gets located and which behaves as a guide for diamond embedded wires during the slicing of ingot. Also, this JIG mechanism protects and holds the wires from sliding down and miss the designated location of slicing during the process as the slicing of cylindrical ingot is being done longitudinally. Further, the parallel bars of the JIG mechanism are made such a way that the slurry and debris from the slicing automatically gets released.

12 Claims, 10 Drawing Sheets

LONGITUDINAL SILICON INGOT SLICING MACHINE AND JIG FIXTURE

TECHNICAL FIELD

The present invention relates to the field of preparation of semiconductor wafers from silicon ingot and maximizing overall chips per wafer. More specifically, it discloses a method of lateral slicing a silicon ingot diagonally for production of rectangular semiconductor wafers from cylindrical semiconductor ingot instead of circular wafers that increases overall chips per wafer ratio and decreases waste due to conflict between chip and wafer geometry compared to circular wafers.

DESCRIPTION OF RELATED ART

Conventionally, the silicon wafers which are used in fabrication of silicon chips are made by slicing circular wafers from cylindrical, purified silicon ingots, where ingots are sliced perpendicular to longitudinal axis of the silicon ingot resulting in a silicon wafers circular in shape. But this resulting circular wafers made from the conventional method has number of drawbacks such as waste of space due to conflict in geometry of fabricated chips on wafer and geometry of wafer itself. Since, the chips are square in shape while wafers are circular in shape, there is lot of wasted space on each of wafers due to a conflict with geometry. Other factors in addition to the waste due to geometry conflict are waste due to edge exclusion and polishing that further reduces the available wafer space for usable chips.

One such apparatus and method of slicing silicon ingot into circular wafers is disclosed in U.S. Pat. No. 6,065,462A which teaches about apparatus and method for slicing a work piece, in particularly, a polysilicon or single crystal silicon ingot, utilizing a closed loop of diamond impregnated wire in which the work piece (or ingot) is rotated about its longitudinal axis as the diamond wire is driven orthogonally to it and advanced from a position adjoining the outer diameter of the ingot towards its inner diameter making circular wafers from the ingot.

Further, U.S. Pat. No. 5,829,424A patent discloses a device for wire sawing comprising a sawing region in which a piece to be sawed bears against the wire adapted to be displaced by reciprocating or continuous movement to saw the piece and a device for directing the wire comprising a payout spool supplying new wire to the sawing zone and a take-up spool collecting the used wire from the sawing zone. Hence, this invention discloses the device that slices silicon ingot into circular wafers using wires embedded with diamond dust.

Therefore, there exists a need of a method and system that can maximize the overall chips per wafer fabricated from silicon ingot. Further, there is a need of a system and method of fabrication of semiconductor chips from silicon ingot by slicing rectangular wafers lengthwise from the ingot to minimize waste of space due to conflict in geometry of chips and wafer in addition to waste due to edge exclusion and polishing. Moreover, there is a need of a system and method that reduces inclusion or defects in the ingot wafer slices.

SUMMARY

This summary is provided to introduce a selection of concepts in a simplified form that are further disclosed in the detailed description of the invention. This summary is not intended to identify key or essential inventive concepts of the claimed subject matter, nor is it intended for determining the scope of the claimed subject matter.

The subject matter disclosed herein address the above-mentioned need of a method and a system for fabrication of semiconductor wafers by slicing the silicon ingots on its side to produce rectangular wafers which results in area gain and hence gain in number of chips per wafer, minimizes waste due to conflict between geometry of chips and ingots as conventional method teaches about slicing of silicon ingot forming round wafers while the fabricated chips on wafers are square in geometry that causes conflict in geometry hence lot of wasted space. While, the present disclosure teaches about slicing of conventional silicon ingot lengthwise to fabricate wafers rectangular in geometry and as the chips are square in geometry, there is no conflict in geometry that in turns minimizes waste due to geometry as well as waste due to edge exclusion and polishing which further reduces the available wafer space for usable chips.

The method disclosed herein teaches about the advantages of lateral slicing of silicon ingot to fabricate rectangular silicon wafers over conventional slicing of ingot to fabricate round wafers. Further, the present invention teaches about the process and method of lateral slicing of the silicon ingot as the silicon ingots grown by the Czochralski pulling method are cylindrical in geometry that makes idea of slicing of silicon ingot in lateral direction or longitudinally using diamond embedded wire, non-obvious for the person of relevant art. Slicing of round surface of cylindrical ingot longitudinally into thin silicon wafers using system of plurality of parallel diamond embedded wires without sliding of wires on the surface of the ingot is work which is not obvious. Hence, this invention discloses a method for slicing of silicon ingot in longitudinal direction using the system or apparatus of multiple parallel diamond embedded wires.

The method of lateral slicing of silicon ingot to fabricate rectangular silicon wafers maximizes the chip yield due to the fact that the change in direction of cutting of silicon ingot to longitudinal increases the area by 1.95 times than conventional transverse cutting of ingot in round silicon wafers hence increases number of die per wafer.

Now, using the present method and mathematics, hereby it would be proved that the longitudinal slicing increase area of wafers and hence results in 14% increment in chips per wafer. Let's consider a conventional cylindrical ingot having radius (R) and Length (L), if we slice the cylindrical ingot horizontally using traditional slicing methods, resulting wafers would be circular in geometry with diameter of 2R.

Area of resulting circular wafer=$\pi R^2$

Number of Wafers possible=Length of Ingot (L)/Thickness of Wafer (t)

n(wafer_circular)=L/t

Now, considering longitudinal Slicing of same ingot, Number of possible wafers will be defined by the diameter of the ingot.

N (wafer_longitudinal)=Diameter of Ingot/Thickness of wafer

Hence, N=2R/t

Area of Longitudinal Wafer=Length of Ingot*Xn

Where X is half width of a longitudinal slice

And n is a number between 1 and R/t

Where, $$Xn = 2 * \sqrt[2]{(Rw^2 - n^2 t^2)}$$

Now, to find area of single longitudinal cut is given by, $$A(\text{longitudinal}) = L(\text{ingot}) * Xn$$
$$= L(\text{ingot}) * 2 * \sqrt[2]{(Rw^2 - n^2t^2)}$$
$$\text{Hence, Total Area} = 2 * \sum_{n=1}^{R/t} L(\text{ingot}) * 2 * \sqrt[2]{(Rw^2 - n^2t^2)}$$

Now, comparing to Horizontal Cuts, $$\frac{\text{Total Area in Longitudinal Cut}}{\text{Total Area in Horizontal Cut}} = \frac{4 * L(\text{ingot}) * \sum_{n=1}^{R/t} \sqrt[2]{(Rw^2 - n^2t^2)}}{n(\text{wafer}_{circular}) * \pi * R^2(\text{wafer})}$$

So, the ratio of Area λ is given by, $$\frac{4 * \sum_{n=1}^{R/t} \sqrt[2]{(Rw^2 - n^2t^2)}}{\pi * Rw^2}$$

Thus, required feasibility λ>1.25

Thus, due to increase in the area of silicon wafers by longitudinal slicing instead of horizontal/transverse slicing, the chip yield increases by 14% that means 14% more chips gets fabricated by longitudinal slicing.

According to an embodiment, the method of present invention uses novel wire machines apparatus having plurality of diamond embedded wire mechanism for longitudinal slicing of ingot. The system of present embodiment further comprises a novel JIG that makes longitudinal slicing of silicon ingot possible. The JIG of present embodiment comprises of plurality of parallel bars between which diamond dust embedded wires gets located and which behaves as a guide for diamond embedded wires during the slicing of ingot. Also, this JIG mechanism protects and holds the wires from sliding down and miss the designated location of slicing during the process as the slicing of cylindrical ingot is being done longitudinally. Further, the parallel bars of the JIG mechanism are made such a way that the slurry and debris from the slicing automatically gets released.

BRIEF DESCRIPTION OF DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and structures disclosed herein. The description of a method step or a structure referenced by a numeral in a drawing is applicable to the description of that method step or structure shown by that same numeral in any subsequent drawing herein.

DETAILED DESCRIPTION OF INVENTION

The embodiment herein and the various features and advantageous details thereof are explained more fully with reference to the non-limiting embodiments and detailed in the following description. Descriptions of well-known components and processing techniques are omitted so as to not unnecessarily obscure the embodiments herein. The examples used herein are intended merely to facilitate an understanding of ways in which the method and embodiments herein may be practiced and to further enable those of skill in the art to practice the embodiments herein. Accordingly, the examples should not be construed as limiting the scope of the embodiments herein.

According to an embodiment, the present invention discloses a novel method of longitudinal slicing of silicon ingot to maximize the chip yield where the longitudinal slicing refers to the longitudinal cutting of cylindrical silicon ingot along its longitudinal axis using any of the cutting apparatus of silicon ingot. Further, the method disclosed herein teaches about advantages of lateral slicing of silicon ingot over conventional transverse slicing of silicon ingot. According to the present invention, the method and system for lateral slicing of cylindrical silicon ingot comprises of a conventional diamond embedded wire saw or wire slicing system with novel slicing arrangement for longitudinal slicing of ingot without sliding or misplacement of wires during slicing operation where the ingot to fabricate wafer is configured longitudinally to the running direction of wires. The method and system of present invention uses a JIG fixed over the silicon ingot using JIG fixtures where the said JIG further comprises plurality of parallel rods to locate and guide parallel diamond embedded wires between parallel rods of JIG and also to hold the wires from sliding down and miss the designated location of slicing. One another embodiment of present invention uses a conventional circular metal blade saw for cutting silicon ingot longitudinally with novel slicing arrangement and method of present invention. Further, according to one another embodiment, the slicing of cylindrical silicon ingot is done at an angle, not perpendicular to axis of the cylindrical ingot.

Figure 1A:
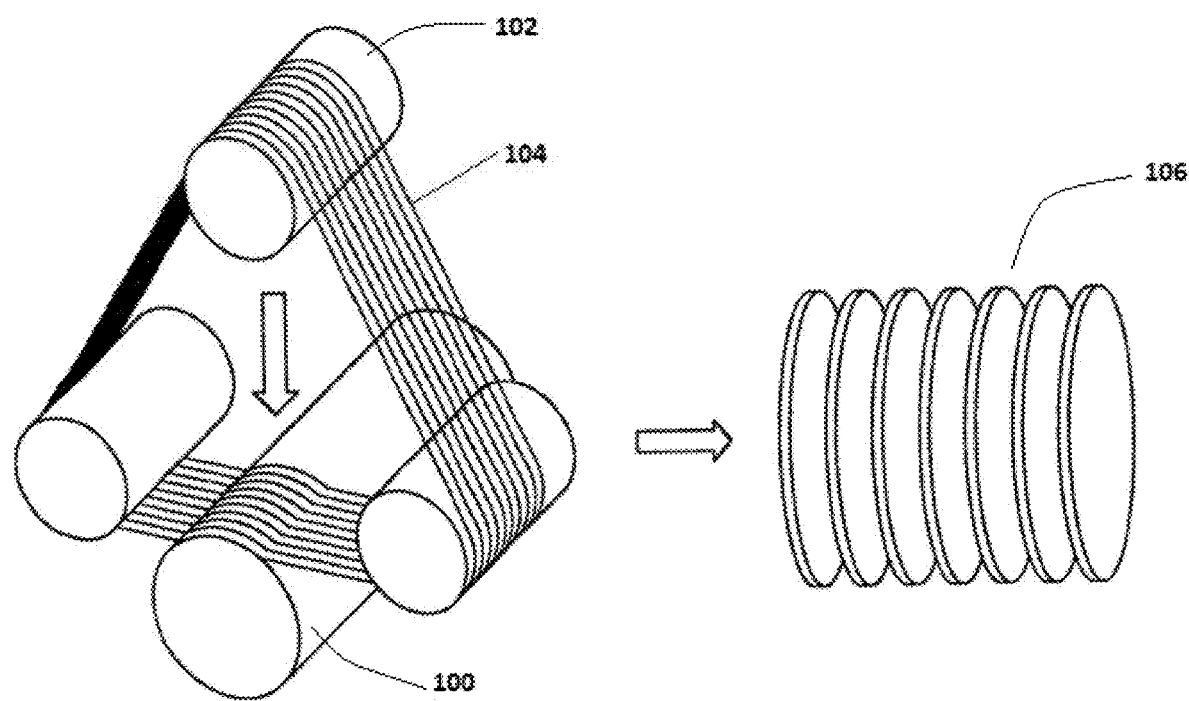
FIG. 1A illustrates diagram of traditional slicing arrangement for transversal slicing of circular wafers.
Figure 1B:
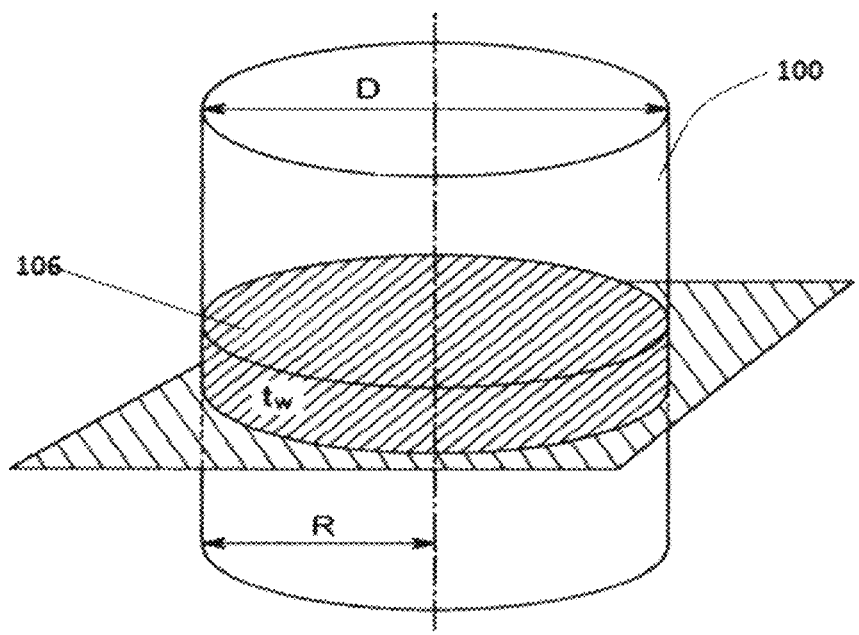
FIG. 1B discloses Slicing geometry for a silicon ingot in conventional transversal slicing.
Figure 1C:
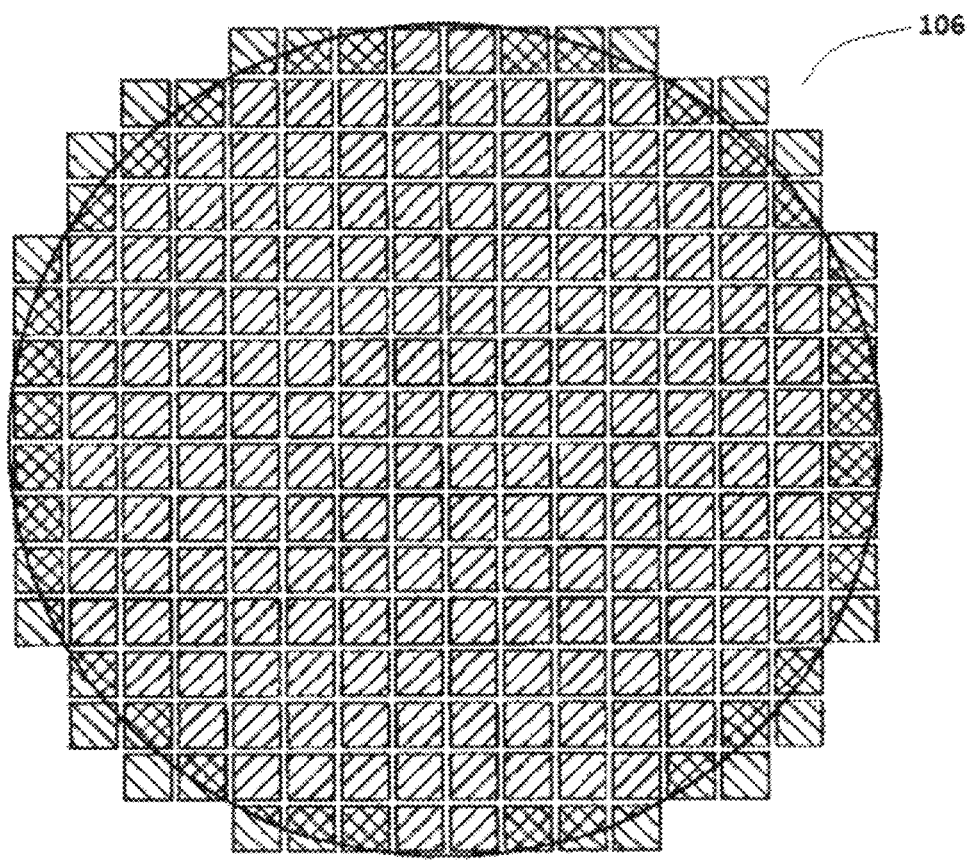
FIG. 1C shows loss of chips due to conflict in geometry of chips and round wafer in conventional transversal slicing.

Now referring to FIG. 1A and FIG. 1B which respectively illustrates diagram of traditional slicing arrangement for transversal slicing of circular wafers and Slicing geometry for a silicon ingot in conventional transversal slicing. In FIG. 1A, the conventional system for slicing of silicon ingot 100 with a parallel diamond embedded wire 104 raw which are wound around three grooved rollers 104. The silicon ingot 100 is configured transversely that as a result, fabricates round silicon wafers 106. FIG. 1C illustrates the resulting round wafer fabricated from transversal slicing of silicon ingot and chips lost in conventional slicing due to conflict in geometry of chips which are square with geometry of wafer which is circular. In addition to loss due to conflict in geometry, there are other losses and disadvantages in conventional slicing such as loss due to edge exclusion and polishing that further reduces the available wafer space for usable chips.

Figure 2A:
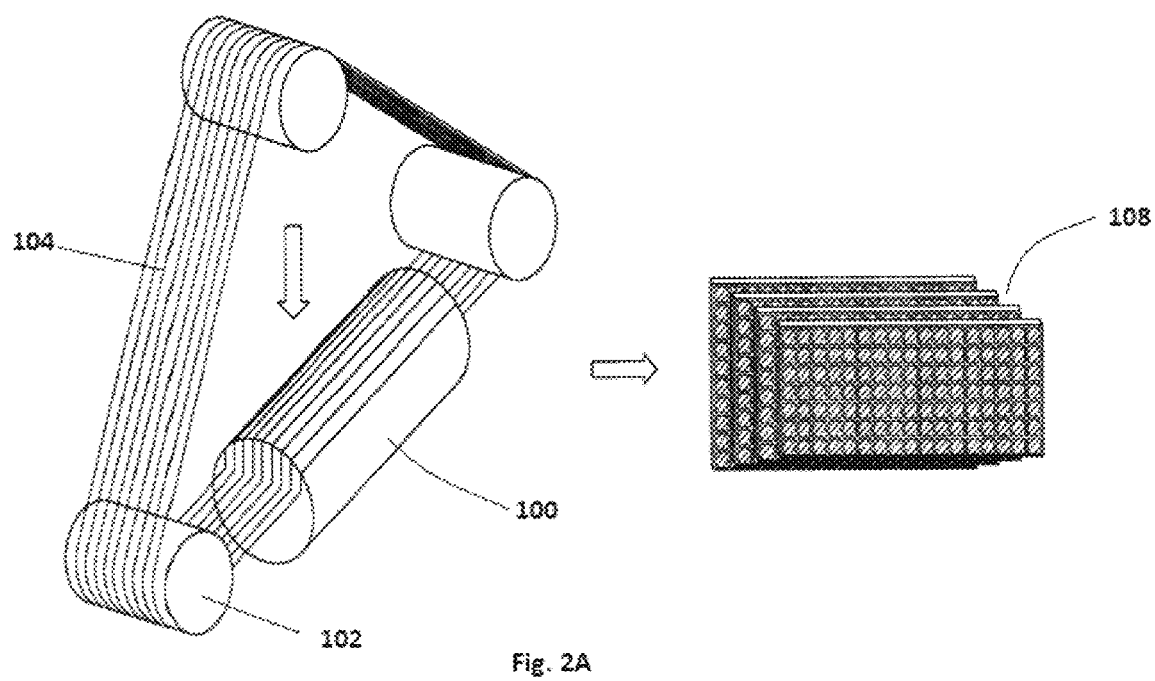
FIG. 2A exemplarily illustrates one embodiment of novel slicing arrangement for longitudinal slicing of silicon ingots for fabrication of rectangular wafers and to maximize chip yield.

FIG. 2A discloses one embodiment of novel slicing arrangement for lateral slicing of silicon ingots 100 for fabrication of rectangular wafers 108 and maximize chip yield. While, FIG. 2B exemplarily illustrates view of novel slicing of the ingot longitudinally. Here, the system for slicing of ingot is also same as the system for slicing in FIG. 1A having plurality of parallel diamond embedded wire 104 wound around three grooved rollers 104 for continuous and parallel running of diamond embedded wires but with a method of novel arrangement of silicon ingot 100 laterally that makes the present invention non-obvious for the person skilled in the art. The diagonal slicing of silicon ingot is being done using method of present invention that makes possible parallel slicing of curvy surface of silicon ingot using system with plurality of diamond embedded wires or circular blade saw without sliding or misplacement of wires or ingot while slicing or cutting due to surface of silicon ingot.

Figure 2B:
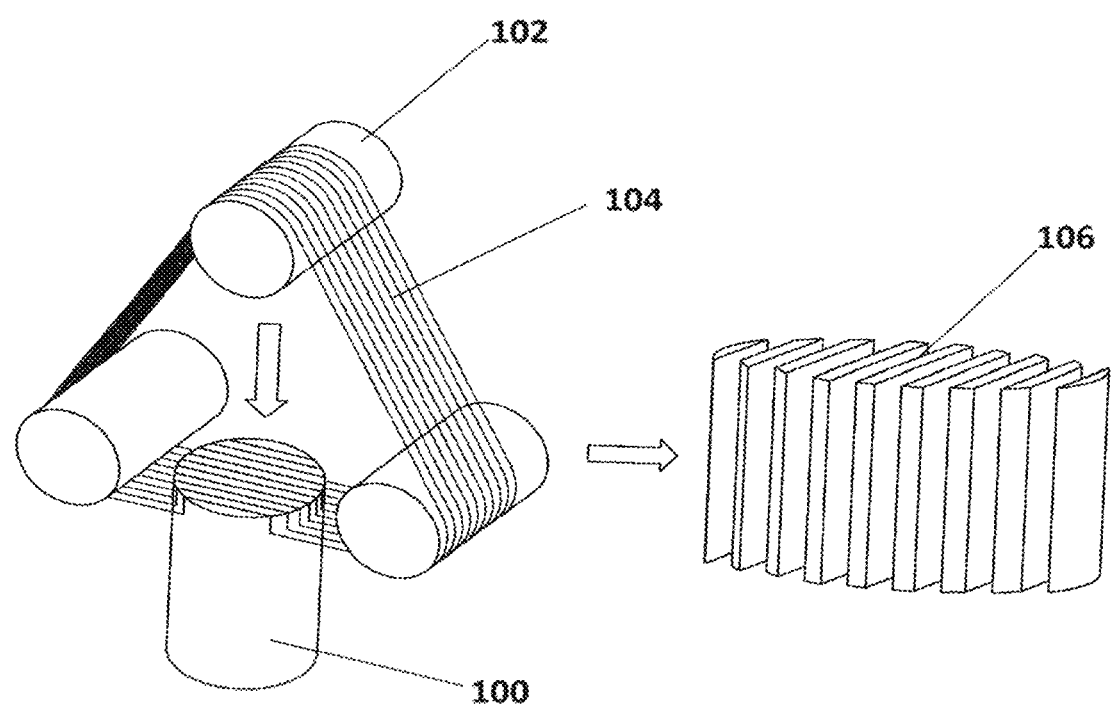
FIG. 2B exemplarily illustrates one another embodiment of novel slicing arrangement for longitudinal slicing of silicon ingot for fabrication of rectangular wafers and to maximize chip yield.
Figure 2C:
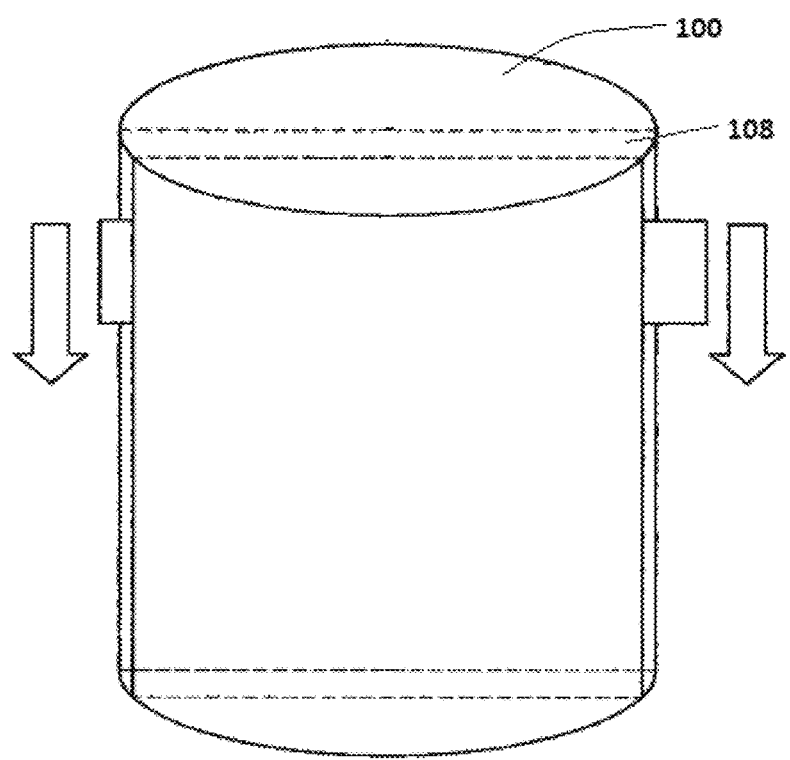
FIG. 2C exemplarily illustrates view of novel slicing of the ingot longitudinally.

Referring to FIG. 2C, it illustrates one another exemplary embodiment for novel slicing of silicon ingot longitudinally from end of cylindrical ingot where JIG (not shown) to hold and guide diamond embedded wires of slicing apparatus is configured at the end of the cylindrical silicon ingot using JIG fixture. While FIG. 3D of present embodiment discloses diameter and other parameters of single slice in longitudinal slicing according to present embodiment of method and invention.

Method of longitudinal slicing of silicon ingot to fabricate rectangular wafer increases effective area and hence chip yield by 14% compared to conventional transverse or horizontal slicing which is hereafter proved using mathematical formulas and dimensions shown in drawings. Let's consider a conventional cylindrical ingot having radius (R) and Length (L) shown in FIG. 1B, if we slice the cylindrical ingot horizontally using traditional slicing methods, resulting wafers would be circular in geometry with diameter of 2R.

Area of resulting circular wafer = $\pi R^2$

Number of Wafers possible = Length of Ingot (L)/Thickness of Wafer (t)

n(wafer_circular) = L/t

Now, considering longitudinal Slicing of same ingot as shown in FIG. 2A and FIG. 2B, Number of possible wafers will be defined by the diameter of the ingot.

N(wafer_longitudinal) = Diameter of Ingot/Thickness of wafer

Hence, N = 2R/t

Figure 2D:
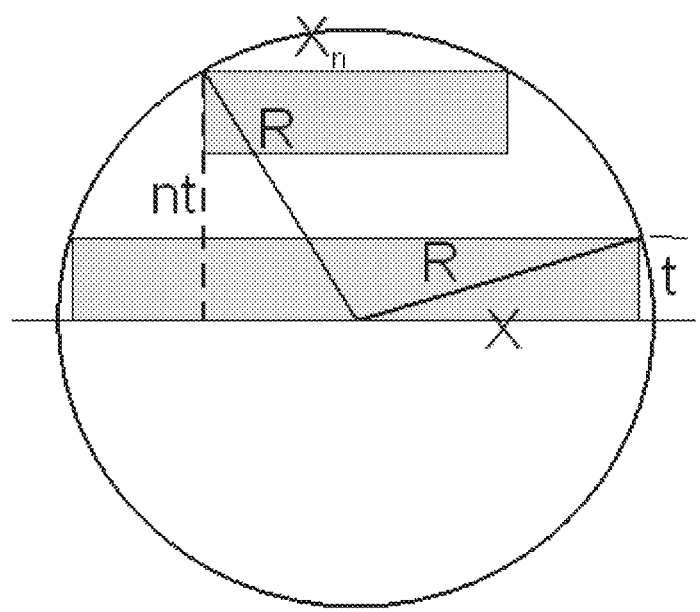
FIG. 2D illustrates width and other parameters of single slice in longitudinal slicing according to present method of invention.

Area of Longitudinal Wafer = Length of Ingot*Xn

Where X is half width of a longitudinal slice that is shown in FIG. 2D

And n is a number between 1 and R/t

Where, $$Xn = 2 * \sqrt[2]{(Rw^2 - n^2 t^2)}$$

Now, to find area of single longitudinal cut is given by, $$A(\text{longitudinal}) = L(\text{ingot}) * Xn$$
$$= L(\text{ingot}) * 2 * \sqrt[2]{(Rw^2 - n^2 t^2)}$$

$$\text{Hence, Total Area} = 2 * \sum_{n=1}^{R/t} L(\text{ingot}) * 2 * \sqrt[2]{(Rw^2 - n^2 t^2)}$$

Now, comparing to Horizontal Cuts, $$\frac{\text{Total Area in Longitudinal Cut}}{\text{Total Area in Horizontal Cut}} = \frac{4 * L(\text{ingot}) * \sum_{n=1}^{R/t} \sqrt[2]{(Rw^2 - n^2 t^2)}}{n(\text{wafer}_{circular}) * \pi * R^2(\text{wafer})}$$

So, the ratio of Area $\lambda$ is given by, $$\frac{4 * \sum_{n=1}^{R/t} \sqrt[2]{(Rw^2 - n^2 t^2)}}{\pi * Rw^2}$$

Our Criterion for feasibility which is self-imposed is that $\lambda$ has to be higher than 1.25. That is the area obtained by longitudinal slicing that has to be 1.25 times the area obtained by the transverse traditional slicing of the ingot.

Thus, required feasibility $\lambda > 1.25$

Due to increase in the area of the wafers, Number of Dies $\Phi$ also increases by 1.2 times than conventional slicing.

Figure 3:
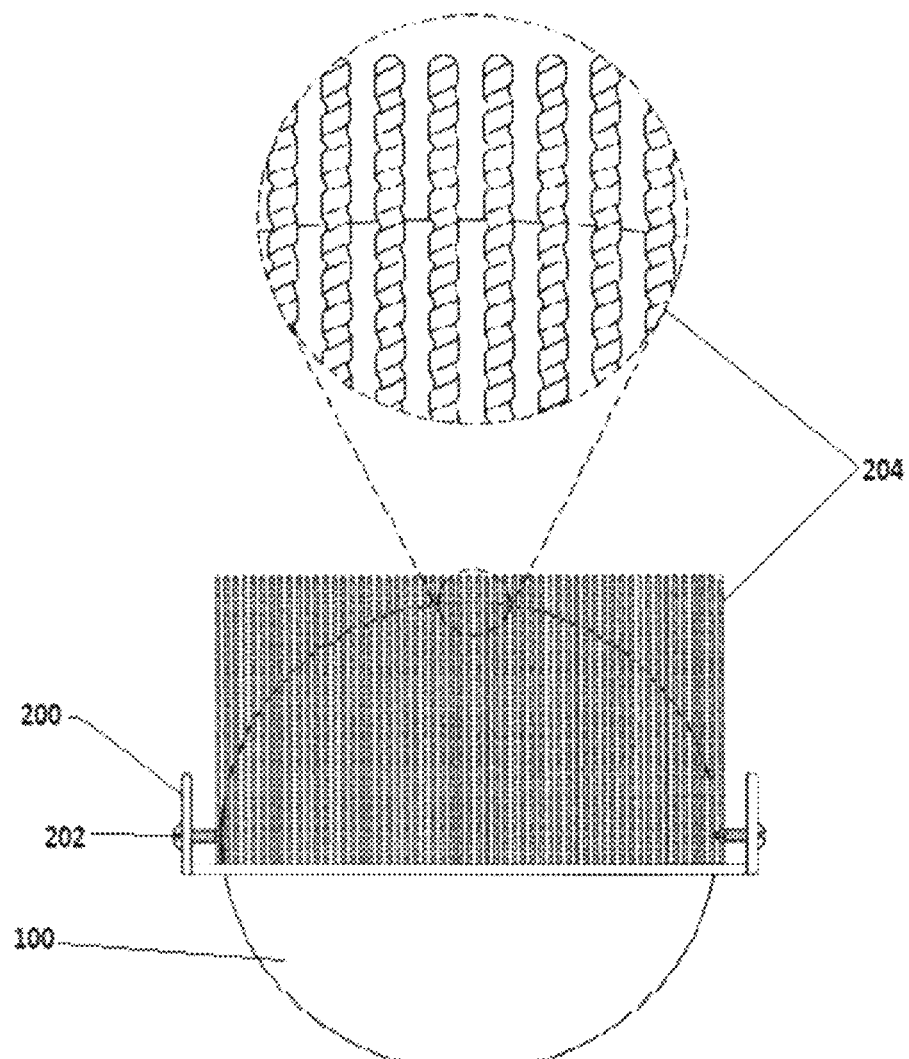
FIG. 3 exemplarily illustrates side view of one embodiment of JIG fixture assembled on ingot with zoomed section view of parallel bars.

Now referring to FIG. 3, which illustrates side view of one embodiment of JIG fixture 200 assembled on ingot 100 to hold the ingot 100 and also to guide the movement of the diamond embedded wires during slicing of ingot. According to present embodiment the JIG 200 comprises of a fixture screw 202 to fix, loose it tight the JIG over the ingot. The JIG 200 of present embodiment further comprises a plurality of parallel rods 204 to align and guide the cutting wires and also to hold the wires from sliding down during the longitudinal slicing of silicon ingot.

Figure 4:
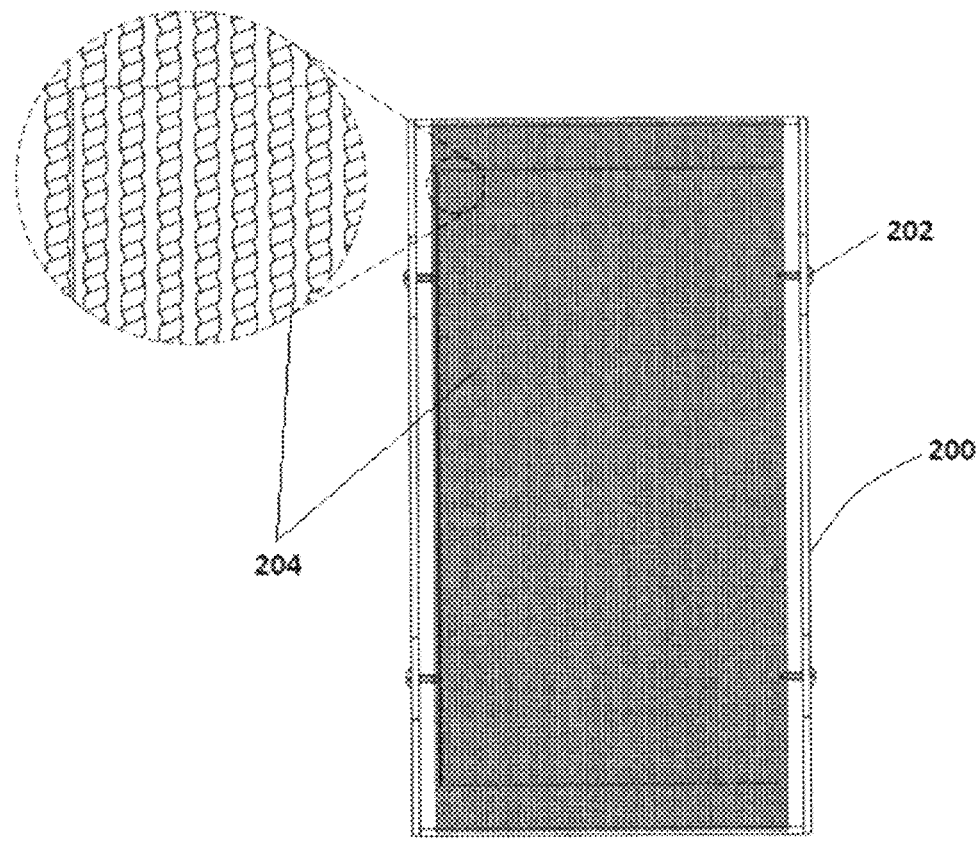
FIG. 4 exemplarily illustrates one embodiment of top view of JIG on ingot with zoomed section view of parallel bars.
Figure 5:
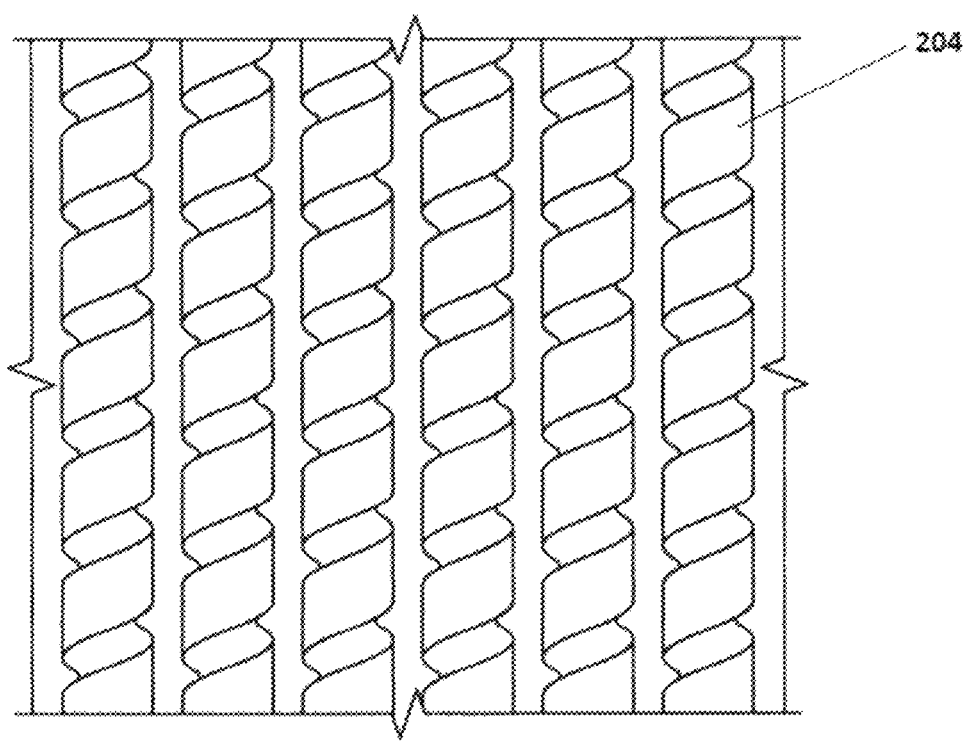
FIG. 5 exemplarily illustrates detailed or zoomed view of parallel rods with relief for debris removal from slurry slicing operation.

FIG. 4 exemplarily illustrates top view of JIG 200 on ingot 100 with zoomed section view of parallel bars. While the FIG. 5 exemplarily illustrates detailed or zoomed view of parallel rods wherein the rods are designed with relief for debris removal from slurry slicing operation.

The foregoing disclosure is not intended to limit the present disclosure to the precise form or particular field of use disclosed. As such, it is contemplated that various alternate embodiments and/or modifications to the present disclosure, whether explicitly described or implied herein, are possible in light of the disclosure. Having thus described embodiments of the present disclosure, person of ordinary skill in the art will recognize that changes may be made in the form and details without departing from the scope of the present disclosure is limited only by the claims.

The invention claimed is:

1. A method for longitudinal slicing of a cylindrical silicon ingot to maximize chip yield comprises;
    configuration of the cylindrical silicon ingot longitudinally to the running direction of a diamond embedded wires;
    Covering the cylindrical silicon ingot using a JIG; and
    Fixing the JIG over the cylindrical silicon ingot using a JIG fixtures;
        wherein the JIG further comprises a plurality of parallel bars to engage and hold the diamond embedded wires to desired location while the cylindrical ingot slicing, and a fixture mechanism to fix the JIG to the cylindrical silicon ingot to hold the ingot during slicing;
        wherein placement of each of the diamond embedded wire between a two consecutive bars that guides and holds the diamond embedded wires during slicing; and slicing the cylindrical silicon ingot longitudinally to fabricate a rectangular silicon wafers that maximizes chip yield and minimizes waste due to conflict in geometry;
        wherein the jig with plurality of bars is attached at the end of the cylindrical ingot in longitudinal slicing of the cylindrical ingot along longitudinal axis of cylindrical ingot.

2. The method of longitudinal slicing of the cylindrical silicon ingot of claim 1, wherein the parallel bars of JIG design is capable of relieving the slurry and debris from slicing.

3. The method of longitudinal slicing of the cylindrical silicon ingot of claim 1, wherein the fabricated wafers from slicing of the cylindrical ingot is rectangular resulting gain in area and hence gain in number of chips per wafer.

4. The method of longitudinal slicing of the cylindrical silicon ingot of claim 1, wherein the longitudinal slicing and resulting rectangular silicon wafers removes conflict between geometry of wafers and chips and hence minimizes area loss.

5. The method of longitudinal slicing of the cylindrical silicon ingot of claim 1, wherein the longitudinal slicing increases the area for chips by approximately 1.95 times than conventional transverse cutting.

6. The method of longitudinal slicing of the cylindrical silicon ingot of claim 1, wherein the longitudinal slicing increases number of chips by approximately 14% than conventional transverse cutting.

7. The method of longitudinal slicing of the cylindrical silicon ingot of claim 1, wherein the longitudinal slicing increases number of dies by approximately 1.2 times than conventional transverse cutting.

8. The method of longitudinal slicing of the cylindrical silicon ingot of claim 1, wherein the longitudinal slicing is also done by conventional circular blade saw.

9. The method of longitudinal slicing of the cylindrical silicon ingot of claim 1, wherein the longitudinal slicing of the cylindrical ingot is done from end of the cylindrical ingot vertically.

10. The method of longitudinal slicing of the cylindrical silicon ingot of claim 1, wherein the slicing of the cylindrical silicon ingot is done on an angle not perpendicular to the axis of cylindrical ingot.

11. The method of longitudinal slicing of the cylindrical silicon ingot of claim 1, wherein the method reduces inclusion or defects in the ingot wafer slices.

12. An apparatus for longitudinal slicing of a cylindrical silicon ingot to maximize chip yield comprises:
    configuration of the cylindrical silicon ingot longitudinally to the running direction of a diamond embedded wires;
    covering the cylindrical silicon ingot using a JIG; and
    Fixing the JIG over the cylindrical silicon ingot using a JIG fixtures;
        wherein the JIG further comprises a plurality of parallel bars to engage and hold the diamond embedded wires to desired location while the cylindrical ingot slicing, and a fixture mechanism to fix the JIG to the cylindrical silicon ingot to hold the ingot during slicing;
        wherein placement of each of the diamond embedded wire between a two consecutive bars that guides and holds the diamond embedded wires during slicing; and slicing the cylindrical silicon ingot longitudinally to fabricate a rectangular silicon wafers that maximizes chip yield and minimizes waste due to conflict in geometry;
        wherein the jig with plurality of bars is attached at the end of the cylindrical ingot in longitudinal slicing of the cylindrical ingot along longitudinal axis of cylindrical ingot.

* * * * *